United States Patent [19]
Momma et al.
[11] E Patent Number: Re. 31,937
[45] Reissued Date of Patent: Jul. 2, 1985

[54] SEMICONDUCTOR DEVICE AND METHOD FOR ITS PREPARATION

[75] Inventors: Yoshinobu Momma, Sagamihara; Yunosuke Kawabe, Yokohama; Osamu Hataishi, Kawasaki, all of Japan

[73] Assignee: Fujitsu Ltd., Kawasaki, Japan

[21] Appl. No.: 240,498

[22] Filed: Mar. 4, 1981

Related U.S. Patent Documents

Reissue of:
[64] Patent No.: 4,231,057
Issued: Oct. 28, 1980
Appl. No.: 960,228
Filed: Nov. 13, 1978

[30] Foreign Application Priority Data

Nov. 29, 1977 [JP] Japan ..... 52-143190

[51] Int. Cl.[3] ..... H01L 27/04
[52] U.S. Cl. ..... 357/50; 357/55; 357/47; 357/23.1

[58] Field of Search ..... 359/49, 23, 50, 55

[56] References Cited

U.S. PATENT DOCUMENTS

| | | | |
|---|---|---|---|
| 4,047,195 | 9/1977 | Allison | 357/55 |
| 4,048,649 | 9/1977 | Bohn | 357/43 |
| 4,051,506 | 9/1977 | Horie | 357/55 |
| 4,106,050 | 8/1978 | Riseman | 357/49 |
| 4,140,558 | 2/1979 | Murphy | 148/175 |

*Primary Examiner*—Martin H. Edlow
*Attorney, Agent, or Firm*—Staas & Halsey

[57] ABSTRACT

An improved means and method for isolating semiconductor devices on a semiconductor substrate, comprising a shallow region formed between the semiconductor substrate and an epitaxial layer of each device, and between a buried layer of each device and an isolation region separating adjacent devices. The shallow region has conductivity type opposite to that of the semiconductor substrate and higher impurity concentration than that of the epitaxial layer.

10 Claims, 21 Drawing Figures

SEMICONDUCTOR DEVICE AND METHOD FOR ITS PREPARATION

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to a semiconductor device and to a method for its preparation. More particularly, this invention relates to a semiconductor device with improved breakdown voltage and integration density, and to a method for its preparation.

2. Description of the Prior Art

Generally, in a bipolar semiconductor device, isolation is necessary to separate electrically between elements, and various techniques for this purpose have been offered.

As one example of such techniques, V-groove isolation with polycrystalline silicon (VIP) is a well known method. This method utilizes a V-shaped groove as an isolation region between elements in the bipolar semiconductor device. The VIP method is explained in detail in the following description and is very important with respect to the present invention. To illustrate the prior art semiconductor device and method for manufacturing the same, reference is made to FIGS. 1–12.

FIG. 1 shows a partial cross-section of a P type silicon semiconductor substrate 10. In FIG. 1, after forming an oxide film 12 over the entire surface of the P type silicon semiconductor substrate 10 and selectively forming windows 14, 16 by patterning the oxide film 12, impurities are diffused through the windows 14, 16; and thereby the N+ type buried layers 18, 20 are formed in the surface of the semiconductor substrate 10.

Referring to FIG. 2, after removing the oxide film 12, an N− type silicon semiconductor layer 22 is formed over the entire area of the buried layers 18, 20 and the semiconductor substrate 10 by epitaxial growth. Here, the Miller indices of the semiconductor substrate 10 are (100), the depth of the buried layers 18, 20 is about 3 to 5 microns and the thickness of the epitaxial layer 22 is about 2 to 3 microns.

Referring to FIG. 3, an oxide film 24 and a silicon niride film 26 are formed on the epitaxial layer 22 by oxidation and SiN deposition, respectively. Then the silicon nitride film 26 and the oxide film 24 are subject to patterning and thereby the windows 28, 30, 32 are formed.

Referring to FIG. 4, V-shape etching is performed in the epitaxial layer 22 and the semiconductor substrate 10 by using the patterned silicon nitride film 24 as a mask, thereby V-shaped grooves (isolation regions) 29, 31, 33 can be formed. Here, as an etching solution, an anisotropic etching solution such as potassium hydroxide (KOH) solution with isopropyl alcohol or ethylene diamine with pyrocatechol is used.

Referring to FIG. 5, oxide films 34, 36, 38 are formed in the V-shape grooves 29, 31, 33 by oxidation.

Referring to FIG. 6, the polycrystalline silicon film 40 is formed on the entire surface of the device by chemical vapor deposition (CVD). The thickness of the polycrystalline silicon film 40 should be at least such that the V-shape grooves 29, 31, 33 are sufficiently buried.

Referring to FIG. 7, the surface of the device is polished so that the polycrystalline silicon films 40 remain only within the V-shape grooves 29, 31, 33.

Referring to FIG. 8, oxide films 42, 44, 46 are formed in the surface of the remaining polycrystalline silicon films 40 by oxidation. Thereby, the polycrystalline silicon films 40 are totally buried within the oxide films.

Referring to FIG. 9, the silicon nitride film 26 is removed by etching, for instance, using phosphoric acid ($H_3PO_4$). In FIG. 9, the oxide film is represented by the numeral 24.

Referring to FIG. 10, P type base regions 48, 50 are formed by ion implantation using, for example, a photoresist as a mask. Here, it should be understood that a diffusion method may also be employed to form the P type base regions 48, 50 as is well known in the prior art.

Referring to FIG. 11, collector electrode windows 52, 62 and emitter electrode windows 56, 58 are formed by patterning the oxide film 24. Then, impurities are diffused through these windows, whereby N+ type collector contact regions 64, 70 and N+ type emitter regions 66, 68 are formed. Thereafter, base electrode windows 54, 60 are formed by patterning the oxide film 24.

Referring to FIG. 12, an aluminum electrode material 72 is evaporated on the entire surface of the device. Then, the aluminum 72 is selectively removed to define a conductor wiring area. Phosphoric acid with an additive of nitric acid may be used for etching the aluminum.

In a semiconductor device as mentioned above, the semiconductor layer 22 formed by the epitaxial growth was relatively thick. However, more recently, such epitaxial layer 22 must be thin because the width of the isolation regions 29, 31, 33 is narrowed so as to obtain high integration density. Usually, the depth of the V-shape groove is determined as about 0.7× width of the isolation region.

As can be seen in FIG. 10, a PNP configuration is formed by the P type base region 48 (50), the N− type epitaxial layer 22 and the P type semiconductor substrate 10. Therefore, when the epitaxial layer 22 becomes thin, the base region 48 (50) and the semiconductor substrate 10 are likely to suffer punch through.

As a method for avoiding such punch through, the N type impurity concentration of the epitaxial layer 22 can be increased. However, in this case, the depletion layer between the base and the collector becomes narrow, and accordingly the capacitance between the base and the collector increases. Therefore, it is not desirable to increase the N type impurity concentration of the epitaxial layer 22 when a high speed transistor is desired.

FIG. 13 shows another example of the prior art bipolar semiconductor device. In FIG. 13, the configuration of the isoplanar type bipolar semiconductor device which has an isolation region 76 comprising, for example, silicon dioxide is disclosed. In FIG. 13, the same reference numerals as that of FIGS. 1 to 13 indicate the same portions.

In this example, the generation of punch through between the base region 48 (50) and the semiconductor substrate 10 is prevented since the N+ type buried layer 18 (20) makes contact with the isolation region. In order to employ such configuration, the isolation region 76 must be wide and, therefore, it is difficult to obtain high integration density. Of course, it is impossible to employ such method, i.e., making the N+ buried layer contact with the isolation region, in the case of the above mentioned VIP method. This prior art method is therefore not useful to isolate between elements.

SUMMARY OF THE INVENTION

An object of the present invention is to provide a semiconductor device which can prevent punch through, and to provide a simple method for preparation of the semiconductor device.

Another object of the present invention is to provide a semiconductor device which has a narrow isolation region, and to provide a simple method for preparation of the semiconductor device.

A further object of the present invention is to provide a semiconductor device which can be prevented from generation of punch through even when an epitaxial layer comprising a portion of the device is thin, and to provide a simple method for the preparation of the semiconductor device.

Still another object of the present invention is to provide a semiconductor device which can be prevented from generation of punch through even when the impurity concentration of the epitaxial layer comprising a portion of the device is low, and to provide a simple method for preparation of the semiconductor device.

The above-mentioned objects can be accomplished by the semiconductor device of the present invention which comprises (a) a semiconductor substrate having a first conductivity type, (b) a plurality of buried layers of a second conductivity type opposite to the first conductivity type selectively formed in the surface of the semiconductor substrate, (c) an epitaxial layer of the second conductivity type formed over the semiconductor substrate and the buried layer, (d) a plurality of regions of the first conductivity type formed in the epitaxial layer, (e) a plurality of isolation regions formed between the buried layers, the isolation regions extending downwardly from the surface of the epitaxial layer to the semiconductor substrate, and (f) a plurality of regions of the second conductivity type formed between the semiconductor substrate and the epitaxial layer, and between the isolation regions and the buried layers, the second conductivity type regions having higher impurity concentration than that of said epitaxial layer.

The above-mentioned semiconductor device can be prepared by the method of the present invention, which comprises the steps of (a) selectively forming a plurality of the layers of a second conductivity type in a semiconductor substrate surface of a first conductivity type, (b) forming the regions of the second conductivity type in the semiconductor substrate surface between the second conductivity type layers, (c) forming the epitaxial layer of the second conductivity type over the entire area of the second conductivity type region and the second conductivity type layers, the epitaxial layer having lower impurity concentration than that of the second conductivity type region.

Additional objects and features of the present invention will appear from the following description in which the preferred embodiment of the invention have been set forth in detail in conjunction with the drawings.

DESCRIPTION OF THE PREFERRED EMBODIMENTS

FIGS. 14 to 17 show the cross-sections during manufacturing steps of a semiconductor device according to an embodiment of the present invention. The semiconductor device in accordance with the present invention comprises N type layers formed between semiconductor substrate and the epitaxial layer, and between the isolation regions and the buried layers, as compared with the prior art semiconductor device explained with reference to FIGS. 1 to 12. The method for preparation of the semiconductor device in accordance with the present invention comprises the step of forming N type layers in the semiconductor substrate surface between the buried layers prior to the step of forming the epitaxial layer as compared with the prior art method explained with reference to FIGS. 1 to 12.

As an N type impurity used in this step, arsenic (As) or anitmony (Sb) are preferably since they have small diffusion coefficients, and thereby the N type layer can be formed shallowly. As a method for forming the N type layer, it is preferable to employ an ion implantation method rather than a diffusion method since it is possible to form a more shallow N type of layer by implantation.

Figure 14:
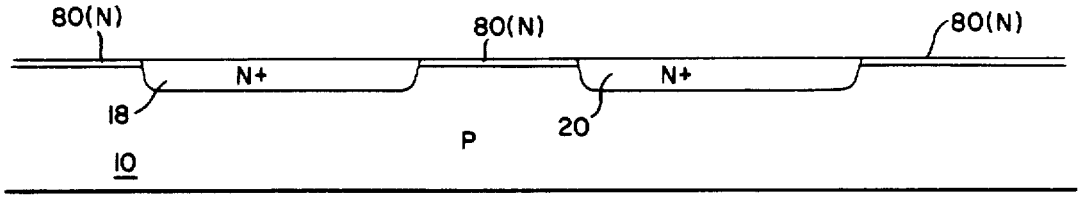
FIGS. 14 to 17 show the cross-sections during manufacturing steps of a semiconductor device according to the present invention.

FIG. 14 shows a partial cross-section of a P type silicon semiconductor substrate 10. In a similar way as explained with reference to FIG. 1, after forming an oxide film over the entire surface of the P type silicon semiconductor substrate 10 and selectively forming windows by patterning the oxide film, impurities are diffused through the windows, thereby N+ type buried layers 18, 20 are formed in the surface of the semiconductor substrate 10. Then, after removing the oxide film an N type impurity such as arsenic or antimony is introduced into the surface of the semiconductor substrate 10. Thereby, an N type shallow layer 80 is formed in the semiconductor substrate surface between the buried layers 18, 20. It is preferable to employ an ion implantation method in introducing the N type impurity in the surface of the semiconductor substrate 10 so as to get a thin layer, and in this case, the N type impurity can be introduced in the entire surface of the semiconductor substrate 10. Although the N type impurity is also introduced in the buried layers 18, 20 the buried layers 18, 20 will remain N+ type. In this step, a diffusion method may also be employed to introduce the N type impurity into the surface of the semiconductor substrate 10.

Referring then to FIG. 14, an N− type silicon semiconductor layer 22 is formed over the entire area of the N type layer 80 and the N+ type buried layers 18, 20 by epitaxial growth. After forming the epitaxial layer 22, the processes for preparing a bipolar semiconductor device are the same as the conventional method explained with reference to FIGS. 3 to 12.

Figure 1:
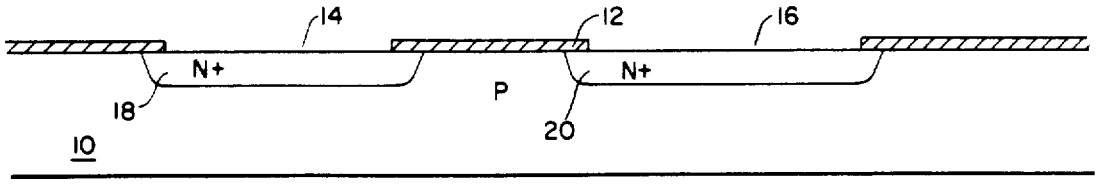
FIG. 1. (PRIOR ART)
FIGS. 1 to 12 show the cross-sections during manufacturing steps of a prior art bipolar semiconductor device utilizing the VIP method.
Figure 2:
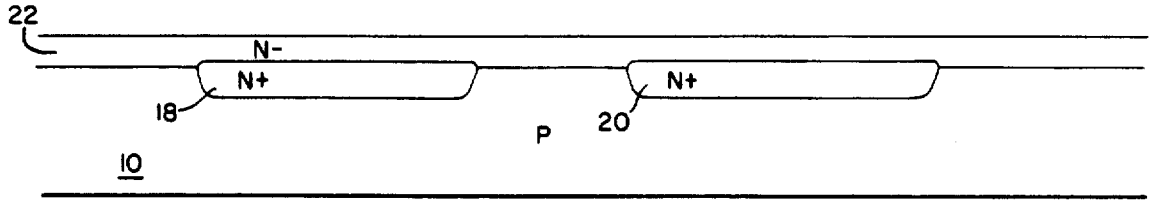
FIG. 2. (PRIOR ART)
Figure 3:
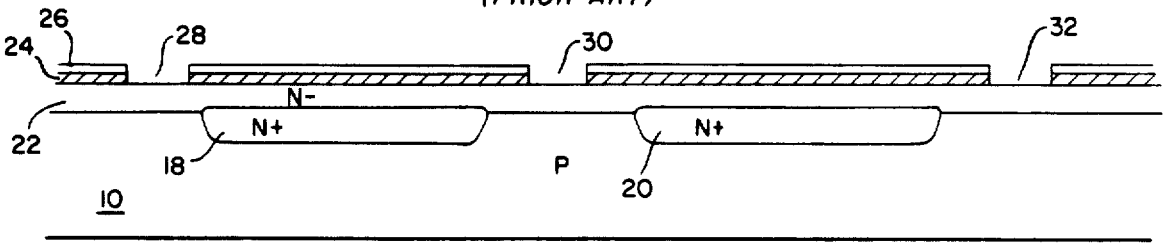
FIG. 3. (PRIOR ART)
Figure 4:
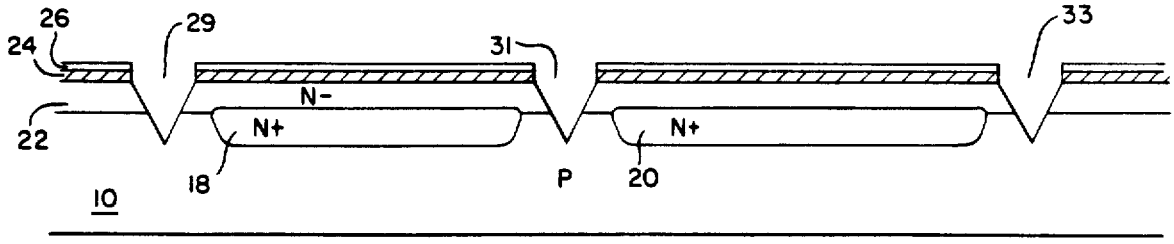
FIG. 4. (PRIOR ART)
Figure 5:
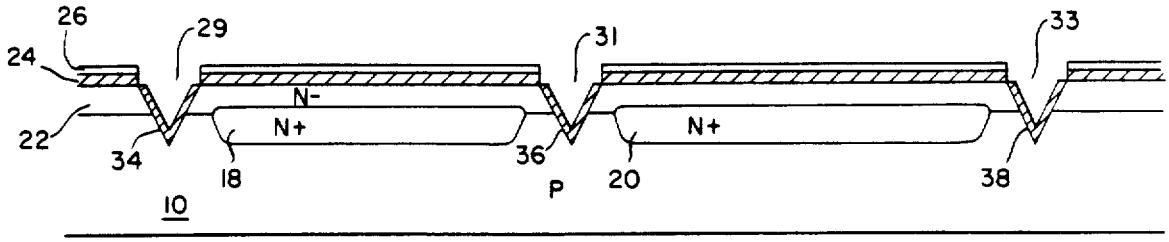
FIG. 5. (PRIOR ART)
Figure 6:
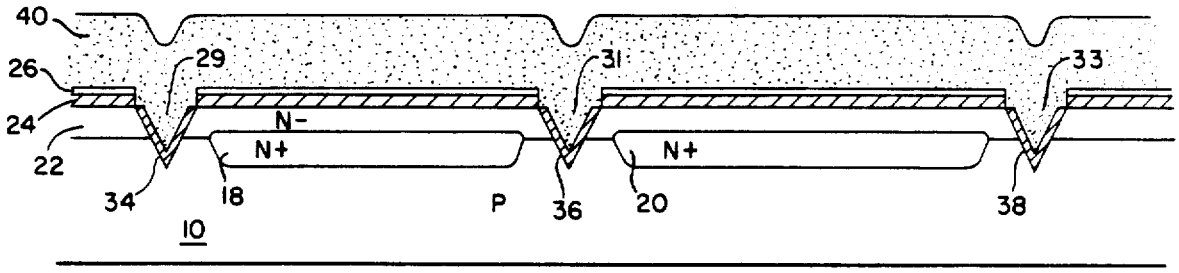
FIG. 6. (PRIOR ART)
Figure 7:
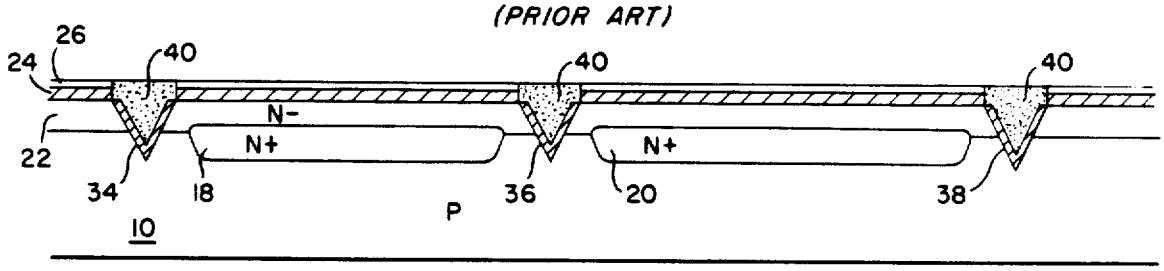
FIG. 7. (PRIOR ART)
Figure 8:
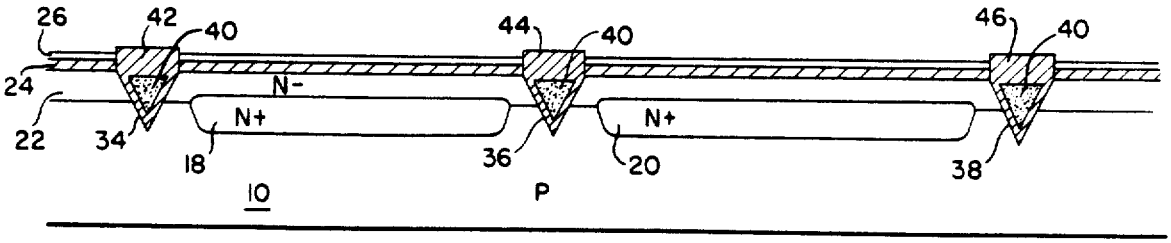
FIG. 8. (PRIOR ART)
Figure 9:
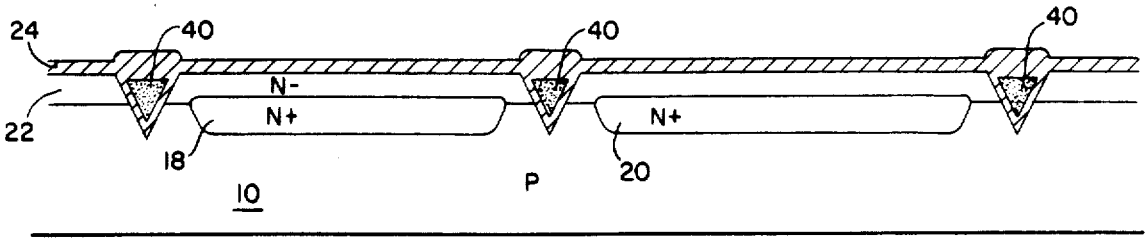
FIG. 9. (PRIOR ART)
Figure 10:
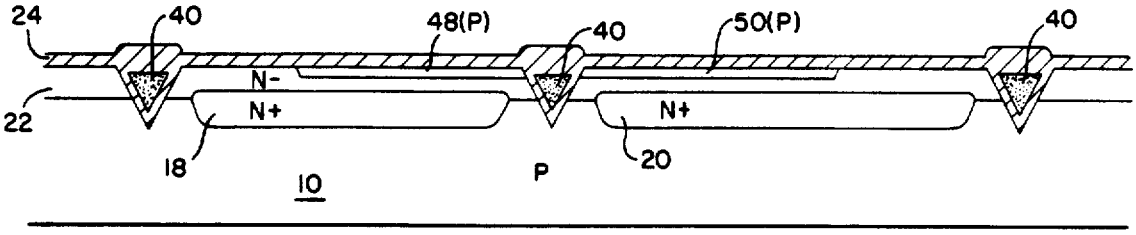
FIG. 10. (PRIOR ART)
Figure 11:
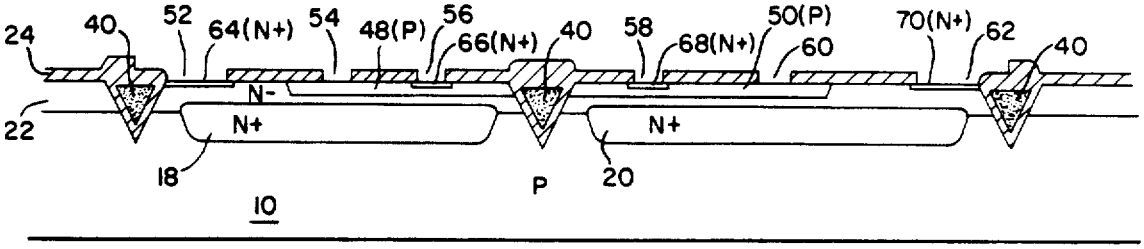
FIG. 11 (PRIOR ART)
Figure 16:
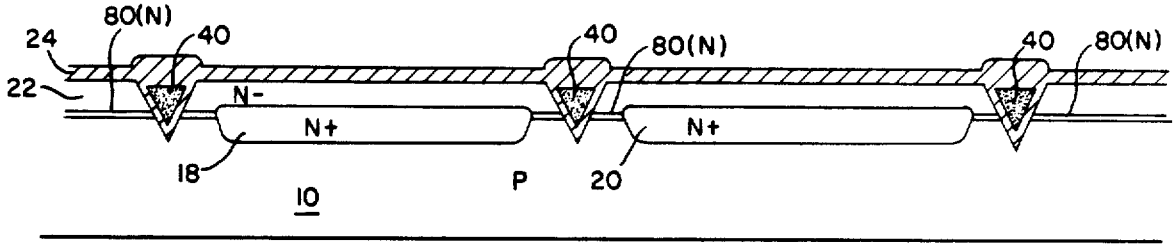

FIG. 16 corresponds to FIG. 9, and the configuration of FIG. 16 is the same as that of FIG. 9 except that FIG. 16 comprises the N type layer 80.

Figure 12:
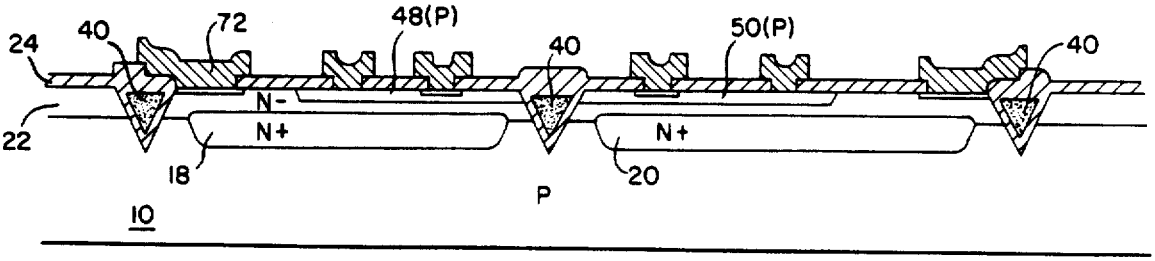
FIG. 12. (PRIOR ART)
Figure 13:
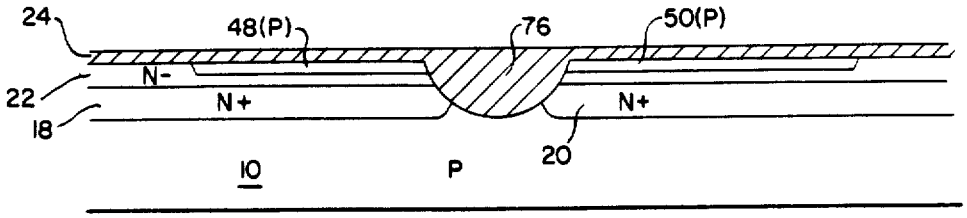
FIG. 13. (PRIOR ART)
FIG. 13 shows the cross-section of another prior art bipolar semiconductor device utilizing the isoplanar method.
Figure 17:
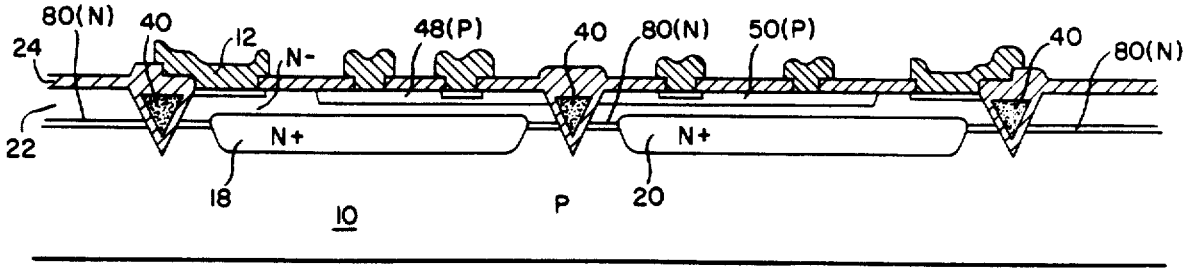

In the same way, FIG. 17 corresponds to FIG. 12, and the configuration of FIG. 17 is the same as that of FIG. 12 except that FIG. 17 comprises the N type layer 80. In FIGS. 14 to 17, the same portions as those explained with reference to FIGS. 1 to 12 are given the same reference numerals. In this embodiment, the punch through voltage between the base regions 48, 50 and the semiconductor substrate 10 can be controlled by selecting the impurity concentration of the N type layer 80. The impurity concentration of the N type layer 80 must be higher than that of the epitaxial layer 22. However, if the impurity concentration of the N type layer 80 is too high, it will be difficult to obtain isolation between elements. In other words, in such case, the layer 80 will become deep after heat treatment of the epitaxial growth to form the semiconductor layer 22. It is preferable that the depth of the N type layer 80 be 0.5 microns, or less, when the thickness of the epitaxial layer 22 is 2 to 3 microns.

FIGS. 18 to 21 show the cross-sections during manufacturing steps of a semiconductor device according to another embodiment of the present invention. The semiconductor device in accordance with this embodiment further comprises P type layers formed between the semiconductor substrate and the N type layers, and between the isolation region and the buried layers as compared with the embodiment as explained with reference to FIGS. 14 to 17.

This configuration is recommended if it is difficult to realize isolation between elements from the relation of the depth of the N type layer 80 or the thickness of the epitaxial layer 22 and the depth of the V-shaped groove isolation region in case of the embodiment as explained with reference to FIGS. 14 to 17.

This configuration is extremely effective in the case where the impurity concentration of the semiconductor substrate cannot be made high in order to reduce parasitic capacitance, In other words, when the impurity concentration of the semiconductor substrate is low, an N type channel is likely to be generated in the semiconductor substrate along the V-shaped groove isolation region. Therefore, it will be difficult to get isolation between elements. The method for preparation of the semiconductor device in accordance with this embodiment further comprises the step of forming a P type layer in the semiconductor substrate between the buried layers prior to the step of forming the N type layer as compared with the method as explained with reference to FIGS. 14 to 17.

Figure 18:
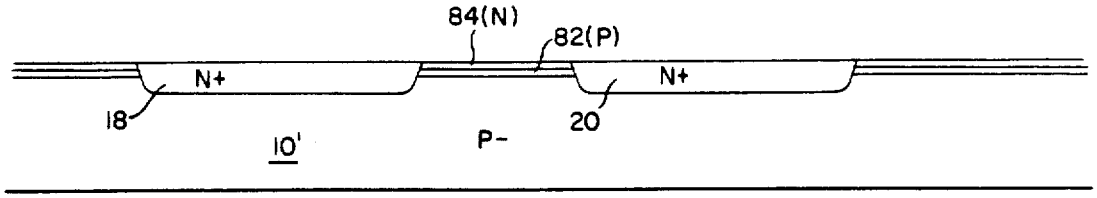
FIGS. 18 to 21 show the cross-section during manufacturing steps of another semiconductor device according to the present invention.

FIG. 18 shows a partial cross-section of a P− type silicon semiconductor substrate 10'. The impurity concentration of the semiconductor substrate 10' is shown as P− for representing the case where the impurity concentration is low. In a similar way as explained with reference to FIG. 1, after forming an oxide film over the entire surface of the P− type silicon semiconductor substrate 10' and selectively forming windows by patterning the oxide film, impurities are diffused through the windows, thereby N+ type buried layers 18, 20 are formed in the surface of the semiconductor substrate 10'. Then, after removing the oxide film, a P type impurity such as boron is introduced in the surface of the semiconductor substrate 10'.

It is preferable to employ an ion implantation method in introducing the P type impurity in the surface of the semiconductor substrate 10' so as to get a thin layer, and in this case, the P type impurity can be introduced in the entire surface of the semiconductor substrate 10'. Thereby a P type layer 82 is formed in the semiconductor substrate surface between the buried layers 18, 20. The impurity concentration of the P type layer 82 must be higher than that of the semiconductor substrate 10', so as to prevent the formation of an N type channel in the semiconductor substrate 10' along an isolation region as explained before. Then, an N type impurity such as arsenic or antimony is introduced in the surface of the semiconductor substrate 10'.

Figure 19:
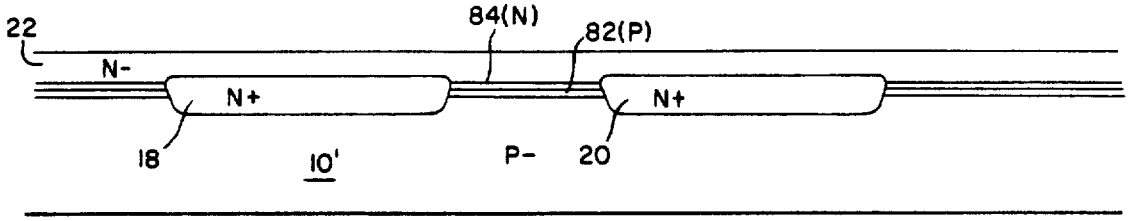

It is also preferable to employ an ion implantation method in introducing the N type impurity. Thereby an N type shallow layer 84 is formed in the semiconductor substrate surface between the buried layers 18, 20. The impurity concentration of the N type layer 84 must be higher than that of the epitaxial layer 22 as shown in FIG. 19. After forming the N type shallow layer 84, processes for preparing a bipolar semiconductor device are the same as the method explained with reference to FIGS. 14 to 17.

Figure 15:
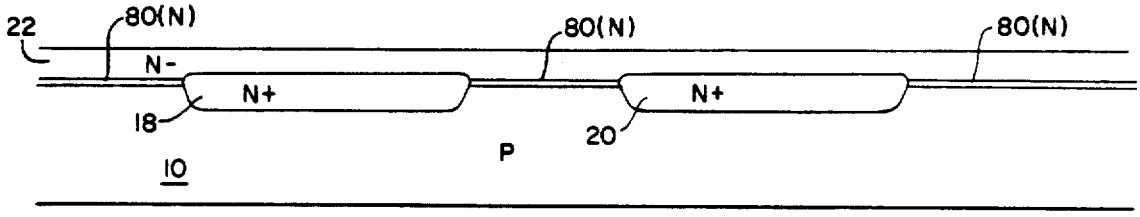

FIG. 19 corresponds to FIG. 14, and the configuration of FIG. 19 is the same as that of FIG. 15 except that FIG. 19 comprises the P type layer 82.

Figure 20:
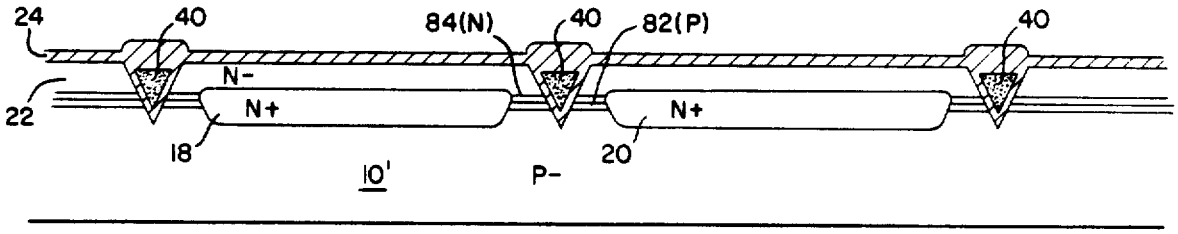
Figure 21:
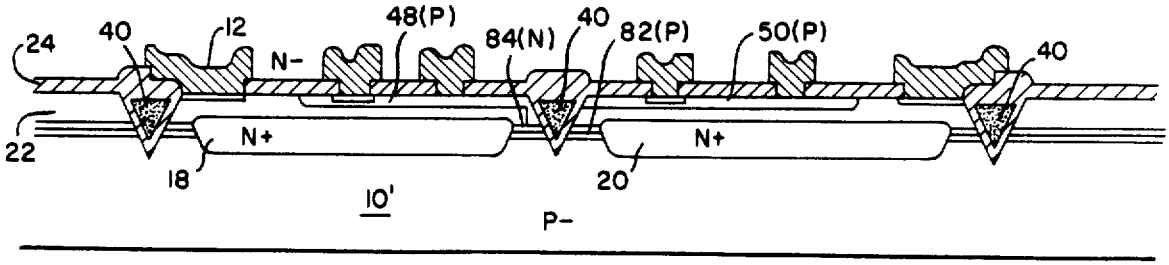

In the same way, FIGS. 20 and 21 correspond to FIGS. 16 and 17, respectively.

The practical data for this embodiment will be indicated as follows.

Impurity concentration of the semiconductor substrate 10': $1\times10^{16}$ atom/cm$^3$ or less Impurity concentration of the buried layers 18, 20: $3\times10^{19}$ to $5\times10^{19}$ atom/cm$^3$ Dose amount of the P type layer 82: $5\times10^{12}$ to $5\times10^{13}$ atom/cm$^2$ (Acceleration voltage: 100 to 200 KeV)

Dose amounts of the N type layer 84: $1\times10^{13}$ to $15\times10^{13}$ atom/cm$^2$ (Acceleration voltage: 50 to 150 KeV)

Thickness of the epitaxial layer 22: 2 microns or less

Depth of the base regions 48, 50: 0.5 microns or less

Depth of the V-shape groove: 2.1 microns

Maximum width of the isolation region: 3 microns or less

As has been described, according to the present invention it is possible to provide a semiconductor device which can avoid punch through even when the isolation region is designed to be narrow in order to obtain high integration density. It will be apparent that many modifications and variations may be effected without departing from the scope of the novel concepts of the present invention; it is intended by the appended claims to cover such modifications and adaptations which fall within the true spirit and scope of the present invention.

what is claimed is:

1. A semiconductor device comprising:

a semiconductor substrate having a first conductivity type;

a plurality of buried layers of a second conductivity type opposite to said first type formed in selected portions of the surface of said semiconductor substrate an epitaxial layer of said second conductivity type formed over said semiconductor substrate and said layers;

a plurality of isolation regions formed between adjacent ones of said buried layers, said isolation regions extending downward from the surface of said epitaxial layer to said semiconductor substrate;

an epitaxial layer of said second conductivity type formed over said semiconductor substrate and said buried layers;

a plurality of first regions having said first conductivity type formed in said epitaxial layer corresponding to said buried layers, each said first region extending to respectively contact said isolation regions; and a plurality of second regions having said second conductivity type formed between said semiconductor substrate and said epitaxial layer, and between said isolation regions and said buried layers, said second conductivity type regions having higher conductivity than that of said epitaxial layer and have a depth shallower than the deepest portion of the buried layers.

2. The device of claim 1, comprising a plurality of third regions of said first conductivity type formed between said second regions and said semiconductor substrate, and between said isolation regions and said buried layers, said third regions having higher conductivity than that of said semiconductor substrate.

3. The device of claim 1 or 2, wherein said conductivity of said second regions is lower than that of said buried layers.

4. The device of claim 1 or 2, wherein said semiconductor substrate is silicon.

5. The device of claim 1 or 2, wherein said epitaxial layer is silicon.

6. The device of claim 1 or 2, wherein said isolation regions comprise a V-shaped groove filled with a material comprising polycrystalline silicon.

7. The device of claims 1 or 2, said first regions having a depth of 0.5 microns or less.

8. The device of claim 1 or 2, said isolation regions having a width of 3 microns or less.

9. The device of claims 1 or 2, said isolation regions having a width of 3 microns or less and a depth of approximately 2 microns or less, and said first regions having a depth of 0.5 microns or less.

10. The device of claims 1 or 2, said isolation regions comprising a V-shape with a width of 3 microns or less and a depth of 0.7 times the width.

* * * * *